US010699830B2

(12) United States Patent
Hamada et al.

(10) Patent No.: US 10,699,830 B2
(45) Date of Patent: Jun. 30, 2020

(54) SUPERCONDUCTING MAGNET DEVICE

(71) Applicants: JAPAN SUPERCONDUCTOR TECHNOLOGY INC., Hyogo (JP); RIKEN, Saitama (JP)

(72) Inventors: Mamoru Hamada, Kobe (JP); Yoshinori Yanagisawa, Ichikawa (JP)

(73) Assignees: JAPAN SUPERCONDUCTOR TECHNOLOGY INC., Hyogo (JP); RIKEN, Saitama (JP)

( * ) Notice: Subject to any disclaimer, the term of this patent is extended or adjusted under 35 U.S.C. 154(b) by 98 days.

(21) Appl. No.: 15/958,233

(22) Filed: Apr. 20, 2018

(65) Prior Publication Data
US 2018/0315531 A1 Nov. 1, 2018

(30) Foreign Application Priority Data

Apr. 27, 2017 (JP) ................................. 2017-088103

(51) Int. Cl.
*H01F 6/00* (2006.01)
*H01F 6/06* (2006.01)
*G01R 33/3815* (2006.01)

(52) U.S. Cl.
CPC ........... *H01F 6/06* (2013.01); *G01R 33/3815* (2013.01)

(58) Field of Classification Search
CPC ...................................................... H01F 6/06
USPC ........................................................ 335/216
See application file for complete search history.

(56) References Cited

U.S. PATENT DOCUMENTS

| 5,532,664 | A  | * | 7/1996  | Buckles   | H01F 6/06 |
|-----------|----|---|---------|-----------|-----------|
|           |    |   |         |           | 174/125.1 |
| 5,581,220 | A  | * | 12/1996 | Rodenbush | H01F 6/06 |
|           |    |   |         |           | 324/318   |
| 5,604,473 | A  | * | 2/1997  | Rodenbush | H01F 6/06 |
|           |    |   |         |           | 335/216   |
| 6,735,848 | B1 | * | 5/2004  | Markiewicz| H01F 6/00 |
|           |    |   |         |           | 174/125.1 |
| 7,015,779 | B2 | * | 3/2006  | Markiewicz| H01F 6/00 |
|           |    |   |         |           | 335/216   |

(Continued)

OTHER PUBLICATIONS

The extended European search report issued by the European Patent Office dated Sep. 17, 2018, which corresponds to European Patent Application No. 18167195.9-1212 and is related to U.S. Appl. No. 15/958,233.

(Continued)

*Primary Examiner* — Alexander Talpalatski
(74) *Attorney, Agent, or Firm* — Studebaker & Brackett PC

(57) ABSTRACT

There is provided a superconducting magnet device that suppresses interference of a part of a tape wire wound around a center axis with another adjacent part. The number of unit wire layer turns of a first coil among the plurality of first coils is smaller than a mean value of the respective numbers of unit wire layer turns of the plurality of first coils, the number of unit wire layer turns of each of the first coils being expressed by a mean value of the respective numbers of turns of the tape wire in the plurality of wire layers, the first coil being disposed at such a position that compressive force acting on the first coil in a direction in which the center axis extends is the largest on the assumption that the respective numbers of unit wire layer turns of the plurality of first coils were the same.

4 Claims, 10 Drawing Sheets

(56) References Cited

U.S. PATENT DOCUMENTS 7,825,760 B2 * 11/2010 Bird .......................... H01F 5/00
335/299
2015/0213930 A1 * 7/2015 Hahn ....................... H01F 6/06
335/216

OTHER PUBLICATIONS

Markiewicz et al.; Design of a Superconducting 32 T Magnet With REBCO High Field Coils; IEEE Transactions on Applied Superconductivity; vol. 22, No. 3; Jun. 2012; 4 pages.

Yanagisawa et al.; Operation of a 400 MHz NMR magnet using a (RE:Rare Earth)$Ba_2Cu_3O_{7-x}$ high-temperature superconducting coil: Towards an ultra-compact super-high field NMR spectrometer operated beyond 1 GHz; Journal of Magnetic Resonance 249; 2014; pp. 38-48.

* cited by examiner

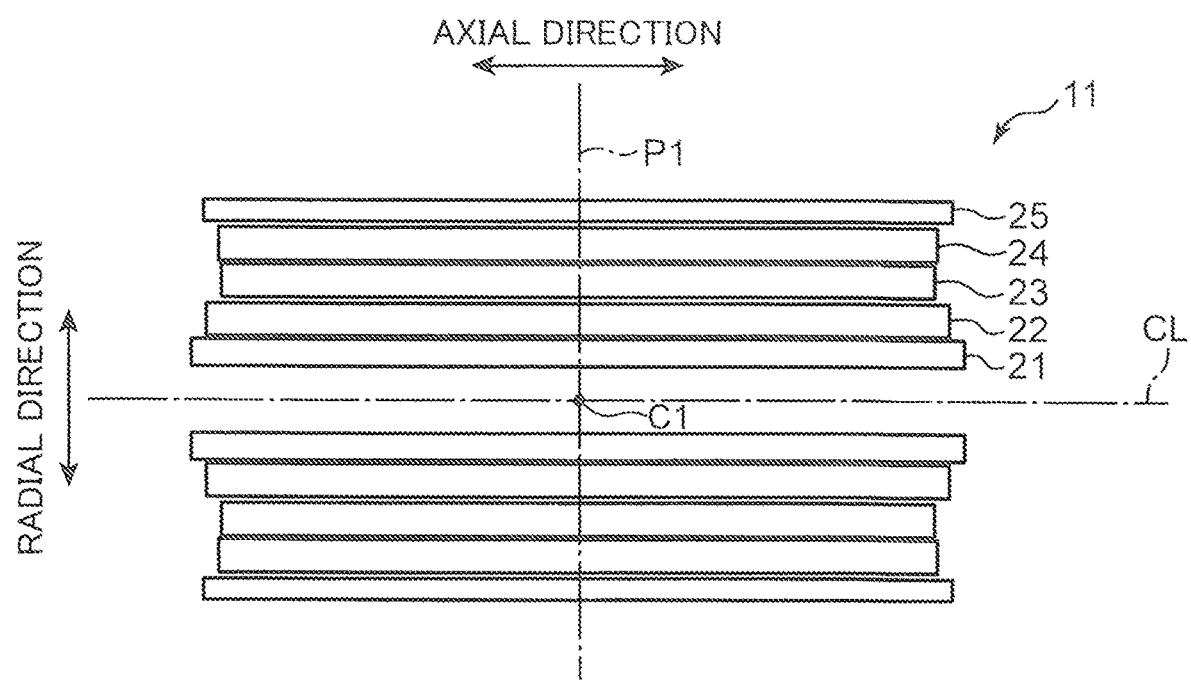

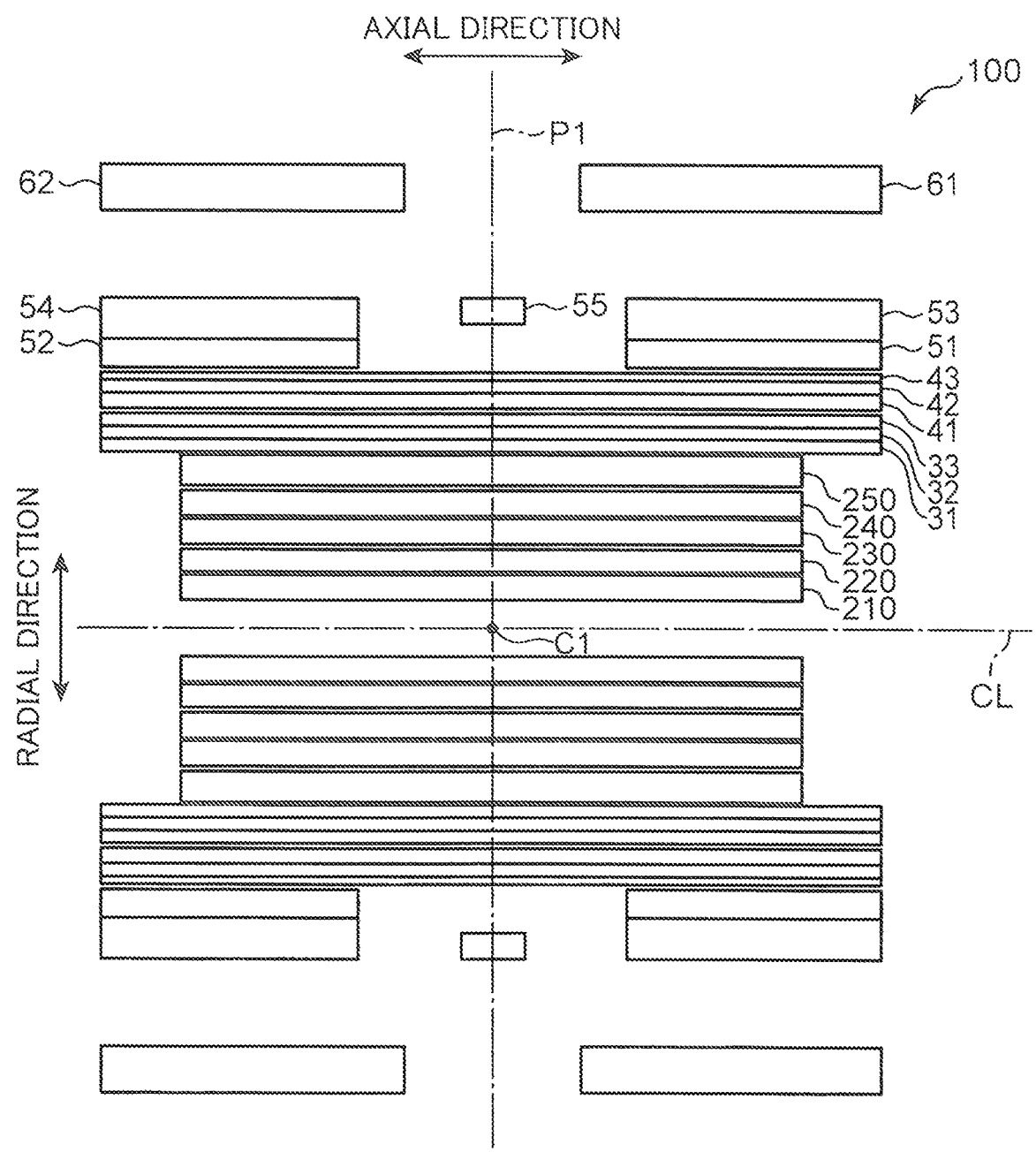

SUPERCONDUCTING MAGNET DEVICE

TECHNICAL FIELD

The present invention relates to a superconducting magnet device including a plurality of superconducting coils arranged concentrically with each other, and more specifically relates to a superconducting magnet device in which each of a plurality of superconducting coils is formed by spirally winding a tape wire around a predetermined center axis.

BACKGROUND ART

A superconducting magnet is an electromagnet composed of a coil formed by winding a wire formed of a superconductor around a predetermined center axis. The superconducting magnet device is driven at high current density by utilizing a superconducting characteristic of zero electric resistance. Therefore, it is possible to generate a high magnetic field which is hardly generated by a general electromagnet.

In order to generate a larger magnetic field, a superconducting magnet device including a plurality of superconducting coils disposed concentrically with each other is known (for example, refer to Markiewicz et al., IEEE TRANSACTIONS ON APPLIED SUPERCONDUCTIVITY, VOL. 22, NO. 3, JUNE 2012, 4300704 (Document 1) and Yanagisawa et al., Journal of Magnetic Resonance 249 (2014) 38-48 (Document 2)). Superconducting magnet devices described in Documents 1 and 2 each include a plurality of outer superconducting coils, and a plurality of inner superconducting coils. The plurality of outer superconducting coils are each formed by winding a round wire formed of a metal-based superconductor around a center axis. The plurality of inner superconducting coils are each formed by winding a tape wire including an oxide-based superconductor around a center axis.

SUMMARY OF INVENTION

In the plurality of inner superconducting coils (that is, the plurality of superconducting coils each formed by winding the tape wire around the center axis) described in each of Documents 1 and 2, there is a risk that a part of the tape wire wound around the center axis interferes with another adjacent part in the direction in which the center axis extends (axial direction). For example, a part of the tape wire runs on another part, or the tape wire itself buckles, so that there is a risk that a part of a wire layer formed by winding the tape wire around the center axis deforms so as to project outward in the direction perpendicular to the center axis.

An object of the present invention is to provide a superconducting magnet device that suppresses interference of a part of a tape wire wound around a center axis with another adjacent part in the direction in which the center axis extends.

The inventors of this application have examined measures for attaining the above object. First, the inventors of this application have examined a state where one part of a tape wire wound around a center axis interferes with another adjacent part in a direction in which the center axis extends. Then, the inventors of this application have obtained knowledge that the state where the one part of the tape wire interferes with the other part is more likely to occur in a center than in an axial end of each of a plurality of superconducting coils.

The inventors of this application have further examined such knowledge. Then, the inventors of this application have obtained knowledge that the interference of the one part of the tape wire with the other part is caused by axial compressive force generated by energization to each superconducting coil.

Next, the inventors of this application have examined a reason why the axial compressive force acts on each superconducting coil by the energization to each superconducting coil. As a result, the following knowledge has been obtained.

A magnetic field generated by the energization to the superconducting coils is inclined to the outside in the direction perpendicular to the center axis (radial direction), toward ends with respect to the center in the axial direction of each superconducting coil. Additionally, an inclination (inclination with respect to the center axis) of the magnetic field at the axial ends of the superconducting coils increases toward the outside with respect to the center in the radial direction of the superconducting coils. The magnitude of the magnetic field generated by the energization to the superconducting coils decreases toward the outside with respect to the center in the radial direction of the superconducting coils.

Although the tendency of change of the magnetic field generated by the energization to the superconducting coils is not sometimes a monotone function depending on arrangement or combination of the superconducting coils, the overall change has the above-described tendency.

In the magnetic field inclined to the center axis of the superconducting coils, not only force directed toward the radial outside but also force directed toward the center in the axial direction acts on each tape wire. When such force directed toward the center in the axial direction acts, the tape wire is collected toward the center in the axial direction. Then, when the force directed toward the center in the axial direction becomes excessive, one part of the tape wire interferes with other part. That is, force obtained by combining the above force directed toward the center in the axial direction is equivalent to axial compressive force which acts on each superconducting coil.

Additionally, the inventors of this application have examined what compressive force acts on each of the plurality of superconducting coils disposed concentrically with each other. As a result, the inventors of this application have obtained knowledge that the respective axial compressive forces that act on the plurality of superconducting coils have different magnitudes.

The inventors of this application who have obtained such knowledge have examined measures for reducing axial compressive force for a superconducting coil on which excessive axial compressive force acts, among the plurality of superconducting coils. Then, the following knowledge has been obtained.

As described above, the axial compressive force that acts on each superconducting coil is force obtained by combining axial force (force directed towards the center in the axial direction) which acts on each tape wire. Therefore, when the number of cross-sections of the tape wire arranged in the axial direction of the superconducting coil in an arbitrary cross-section included in the center axis of the superconducting coil (cross-section expanding in the direction in which the center axis extends, and the direction perpendicular to the center axis), that is, when the number of turns of the tape wire wound around the center axis of the superconducting coil is decreased, axial compressive force which acts on the superconducting coil can be reduced. The present invention is completed based on such knowledge.

A superconducting magnet device according to the present invention is a superconducting magnet device including a plurality of superconducting coils arranged concentrically with each other. The plurality of superconducting coils include a plurality of first superconducting coils each formed by a tape wire, each of the plurality of first superconducting coils has a plurality of wire layers layered in a direction perpendicular to a center axis shared by the plurality of first superconducting coils, each of the plurality of wire layers is formed of the tape wire spirally winding around the center axis a plurality of times, the number of unit wire layer turns of a specific first superconducting coil among the plurality of first superconducting coils is smaller than a mean value of the respective numbers of unit wire layer turns of the plurality of first superconducting coils, the number of unit wire layer turns of each of the first superconducting coils being expressed by a mean value of the respective numbers of turns of the tape wire in the plurality of wire layers, the specific first superconducting coil being disposed at such a position that compressive force acting on the specific first superconducting coil in a direction in which the center axis extends is the largest on the assumption that the respective numbers of unit wire layer turns of the plurality of first superconducting coils were the same.

BRIEF DESCRIPTION OF DRAWINGS

FIG. 6 is a schematic diagram illustrating a schematic configuration of a superconducting magnet device according to a second embodiment of the present invention;

FIG. 7 is a schematic diagram illustrating a schematic configuration of a superconducting magnet device according to Comparative Example 1.

DESCRIPTION OF EMBODIMENTS

Hereinafter, embodiments of the present invention will be described in detail with reference to the attached drawings.

First Embodiment

Figure 1:
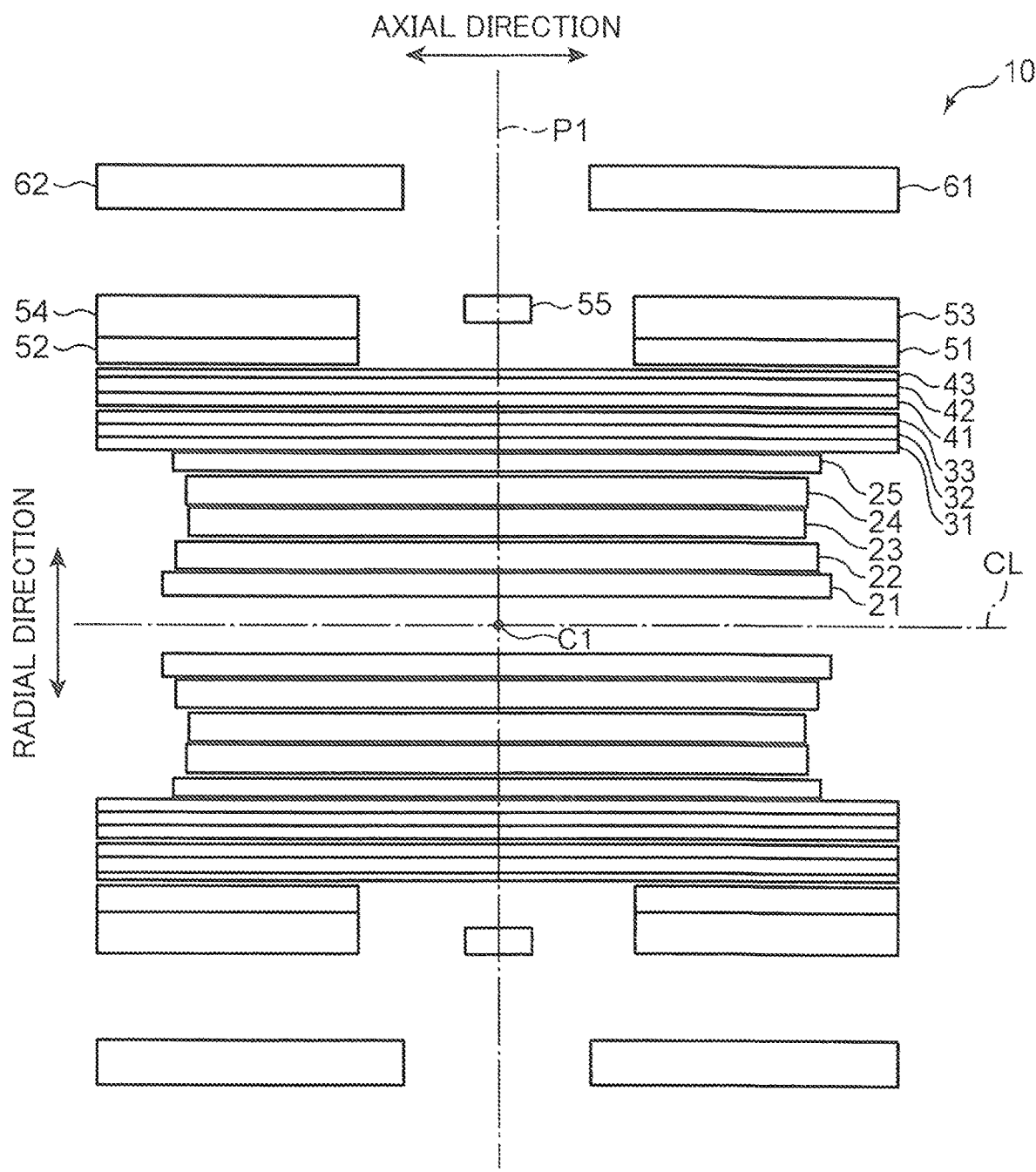
FIG. 1 is a schematic diagram illustrating a schematic configuration of a superconducting magnet device according to a first embodiment of the present invention.

With reference to FIG. 1, a superconducting magnet device 10 according to a first embodiment of the present invention will be described. FIG. 1 is a schematic diagram of the superconducting magnet device 10.

In the following description, the right and left direction in FIG. 1 (direction in which a center axis CL described below extends) is defined as the axial direction, and the up-and-down direction in FIG. 1 (direction perpendicular to the direction in which the center axis CL extends) is defined as the radial direction.

The superconducting magnet device 10 is used for, for example, an NMR apparatus or an MRI apparatus. The superconducting magnet device 10 includes five superconducting coils 21 to 25, three first outer superconducting coils 31 to 33, three second outer superconducting coils 41 to 43, five correction coils 51 to 55, and two shield coils 61, 62.

The five superconducting coils 21 to 25, the three first outer superconducting coils 31 to 33, the three second outer superconducting coils 41 to 43 form, for example, an image pickup magnetic field. That is, the five superconducting coils 21 to 25, the three first outer superconducting coils 31 to 33, and the three second outer superconducting coils 41 to 43 implement a main magnetic field generating coil group. The five correction coils 51 to 55 are coils for uniformizing the spatial distribution of a magnetic field around the center of the main magnetic field generating coil group. The two shield coils 61, 62 form a magnetic field that shields the magnetic field of the main magnetic field generating coil group. Hereinafter, these coils will be described.

First, the five superconducting coils 21 to 25 will be described. Each of the five superconducting coils 21 to 25 generates a magnetic field by energization.

The five superconducting coils 21 to 25 are arranged concentrically with each other. That is, the five superconducting coils 21 to 25 have the common center axis CL, and the outer diameter of a superconducting coil located on the inside is smaller than the inner diameter of a superconducting coil located immediately outside the superconducting coil. The center C1 in the axial direction of each of the five superconducting coils 21 to 25 is located at the same position in the direction in which the center axis CL extends (that is, the axial direction).

Among the five superconducting coils 21 to 25, a coil located on the innermost side is the superconducting coil 21, and a coil located immediately outside the superconducting coil 21 is the superconducting coil 22, a coil located immediately outside the superconducting coil 22 is the superconducting coil 23, a coil located immediately outside the superconducting coil 23 is the superconducting coil 24, and a coil located immediately outside the superconducting coil 24 is the superconducting coil 25.

Figure 2:
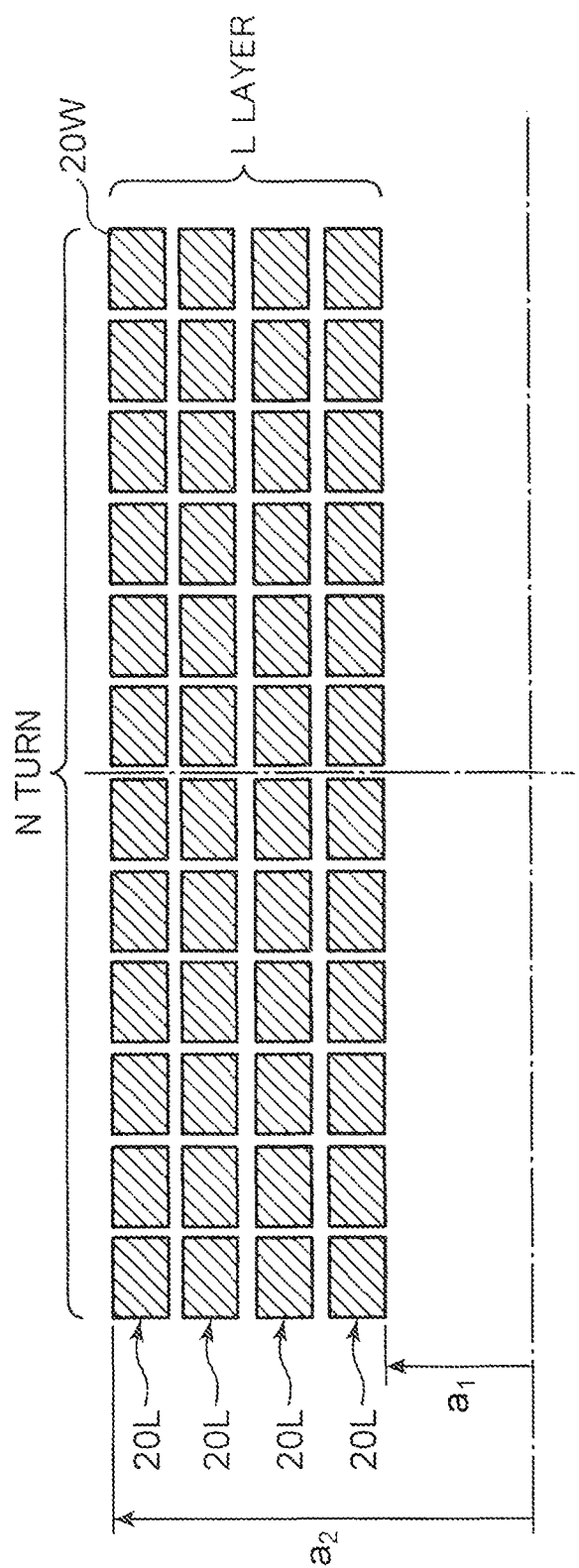
FIG. 2 is a schematic diagram illustrating a schematic configuration of a superconducting coil configuring the superconducting magnet device illustrated in FIG. 1.

With reference to FIG. 2, a specific configuration of each of the five superconducting coils 21 to 25 will be described. FIG. 2 is a schematic diagram illustrating a schematic configuration of the superconducting coil 21. FIG. 2 illustrates a cross-section when the superconducting coil 21 is cut by a plane including the center axis CL (plane expanding in each of the axial direction and the radial direction). The remaining superconducting coils 22 to 25 have structures similar to the structure of the superconducting coil 21. Therefore, only the superconducting coil 21 will be described in detail, and detailed description of the remaining superconducting coils 22 to 25 will be omitted.

The superconducting coil 21 is formed by winding a tape wire 20W around the center axis CL. In FIG. 2, a frame on which the tape wire 20W is wound will be omitted.

The tape wire 20W includes a superconductor. The superconductor is a high-temperature superconductor. The high-temperature superconductor is, for example, an oxide-based superconductor.

The superconducting coil 21 has a plurality of wire layers 20L. The plurality of wire layers 20L are layered in the radial direction. In each of the plurality of wire layers 20L, the tape wire 20W is spirally wound around the center axis CL.

In order to facilitate understanding, FIG. 2 illustrates an example in which the tape wire 20W is wound twelve times in each of the four wire layers 20L. However, the number of the wire layers 20L and the number of turns of the tape wire 20W in each wire layer 20L are not limited to those illustrated in FIG. 2.

Herein, in the example illustrated in FIG. 1, the axial lengths of the plurality of superconducting coils 21 to 25 are different. The detail of this point will be described later.

Now, the three first outer superconducting coils 31 to 33 will be described with reference to FIG. 1. Each of the three first outer superconducting coils 31 to 33 generates a magnetic field by energization. The magnetic fields generated by the energization to the three first outer superconducting coils 31 to 33 are smaller than the magnetic field by the energization to the five superconducting coils 21 to 25.

The three first outer superconducting coils 31 to 33 are arranged concentrically with each other. That is, the three first outer superconducting coils 31 to 33 have the common center axis CL, and the outer diameter of a superconducting coil located on the inside is smaller than the inner diameter of a superconducting coil located immediately outside the superconducting coil. The center in the axial direction of each of the three first outer superconducting coils 31 to 33 is located at the same position in the direction in which the center axis CL extends (that is, the axial direction). In the example illustrated in FIG. 1, the center in the axial direction of each of the three first outer superconducting coils 31 to 33 coincides with the center C1 in the axial direction of each of the five superconducting coils 21 to 25.

Among the three first outer superconducting coils 31 to 33, a coil located on the innermost side is the first outer superconducting coil 31, and a coil located immediately outside the first outer superconducting coil 31 is the first outer superconducting coil 32, and a coil located immediately outside the first outer superconducting coil 32 is the first outer superconducting coil 33.

The axial lengths of the three first outer superconducting coils 31 to 33 are the same each other. The axial length of each of the three first outer superconducting coils 31 to 33 is longer than the axial length of each of the five superconducting coils 21 to 25.

The three first outer superconducting coils 31 to 33 are each formed by winding a wire having a rectangular cross-section or a wire having a circular cross-section around the center axis CL.

The wire forming each of the three first outer superconducting coils 31 to 33 is formed of a superconductor. The superconductor is a low-temperature superconductor. The low-temperature superconductor is, for example, a metal-based superconductor. The metal-based superconductor is, for example, $Nb_3Sn$.

The three first outer superconducting coils 31 to 33 each have a plurality of wire layers, similarly to each of the five superconducting coils 21 to 25. The plurality of wire layers are layered in the radial direction. In each of the plurality of wire layers, a wire is spirally wound around the center axis CL.

Now, the three second outer superconducting coils 41 to 43 will be described with reference to FIG. 1. Each of the three second outer superconducting coils 41 to 43 generates a magnetic field by energization. The magnetic fields generated by the energization to the three second outer superconducting coils 41 to 43 are smaller than the magnetic field generated by the energization to the five superconducting coils 21 to 25.

The three second outer superconducting coils 41 to 43 are arranged concentrically with each other. That is, the three second outer superconducting coils 41 to 43 have the common center axis CL, and the outer diameter of a superconducting coil located on the inside is smaller than the inner diameter of a superconducting coil located immediately outside the superconducting coil. The center in the axial direction of each of the three second outer superconducting coils 41 to 43 is located at the same position in the direction in which the center axis CL extends (that is, the axial direction). In the example illustrated in FIG. 1, the center in the axial direction of each of the three second outer superconducting coils 41 to 43 coincides with the center C1 in the axial direction of each of the five superconducting coils 21 to 25.

Among the three second outer superconducting coils 41 to 43, a coil located on the innermost side is the second outer superconducting coil 41, and a coil located immediately outside the second outer superconducting coil 41 is the second outer superconducting coil 42, and a coil located immediately outside the second outer superconducting coil 42 is the second outer superconducting coil 43.

The axial lengths of the three second outer superconducting coils 41 to 43 are the same each other. The axial length of each of the three second outer superconducting coils 41 to 43 is longer than the axial length of each of the five superconducting coils 21 to 25. The axial length of each of the three second outer superconducting coils 41 to 43 is substantially the same as the axial length of each of the three first outer superconducting coils 31 to 33.

The three second outer superconducting coils 41 to 43 are each formed by winding a wire having a rectangular cross-section or a wire having a circular cross-section around the center axis CL.

The wire forming each of the three second outer superconducting coils 41 to 43 is formed of a superconductor. The superconductor is a low-temperature superconductor. The low-temperature superconductor is, for example, a metal-based superconductor. The metal-based superconductor is, for example, NbTi. A material of the wire in each of the three second outer superconducting coils 41 to 43 is different from a material of the wire in each of the three first outer superconducting coils 31 to 33.

The three second outer superconducting coils 41 to 43 each have a plurality of wire layers, similarly to the five superconducting coils 21 to 25. The plurality of wire layers are layered in the radial direction. In each of the plurality of wire layers, a wire is spirally wound around the center axis CL.

Now, the five correction coils 51 to 55 will be described with reference to FIG. 1. The five correction coils 51 to 55 uniformize the spatial distribution of a magnetic field in the vicinity of the center of the main magnetic field generating coil group (the five superconducting coils 21 to 25, the three first outer superconducting coils 31 to 33, and the three second outer superconducting coils 41 to 43).

The correction coil 51 is located on one end side in the axial direction (right in FIG. 1) with respect to the correction coil 52. The correction coil 51 and the correction coil 52 are each formed by spirally winding a wire around the center axis CL. The correction coil 51 and the correction coil 52 are disposed at plane-symmetric positions with respect to an equator plane P1 (plane including the center C1 and perpendicular to a center axis PL).

The correction coil 53 is located on one end side in the axial direction (right in FIG. 1) with respect to the correction coil 54. The correction coil 55 is located between the correction coil 53 and the correction coil 54 in the axial direction. The correction coil 53, the correction coil 54, and the correction coil 55 are each formed by spirally winding a wire around the center axis CL. The correction coil 53 and the correction coil 54 are disposed at plane-symmetric positions with respect to the equator plane P1.

Now, the two shield coils 61, 62 will be described with reference to FIG. 1. The two shield coils 61, 62 generate a magnetic field that shields a magnetic field which leaks from the main magnetic field generating coil group (the five superconducting coils 21 to 25, the three first outer superconducting coils 31 to 33, and the three second outer superconducting coils 41 to 43) (leak magnetic field).

The shield coil 61 is located on one end side in the axial direction (right in FIG. 1) with respect to the shield coil 62. The shield coil 61 and the shield coil 62 are each formed by spirally winding a wire around the center axis CL. The shield coil 61 and the shield coil 62 are disposed at plane-symmetric positions with respect to the equator plane P1.

The superconducting magnet device 10 is, for example, used for an MRI apparatus. In this case, in the superconducting magnet device 10, image pickup is performed by utilizing a magnetic field formed by the main magnetic field generating coil group (the five superconducting coils 21 to 25, the three first outer superconducting coils 31 to 33, and the three second outer superconducting coils 41 to 43). At this time, the five correction coils 51 to 55 uniformize the spatial distribution of the magnetic field in the vicinity of the center of the main magnetic field generating coil group. The two shield coils 61, 62 form a magnetic field so as to shield the magnetic field of the main magnetic field generating coil group.

When the five superconducting coils 21 to 25 form a magnetic field, that is, when energization to each of the five superconducting coils 21 to 25 is performed, axial compressive force acts on each of the five superconducting coils 21 to 25. When the axial compressive force that acts on each of the five superconducting coils 21 to 25 becomes excessively large, there is a risk that one part of the tape wire 20W of any of the plurality of wire layers 20L included in each of the five superconducting coils 21 to 25 interferes with another part.

In the superconducting magnet device 10, it is possible to suppress the interference of one part of the tape wire 20W of any of the plurality of wire layers 20L included in each of the five superconducting coils 21 to 25 with another part. The reason thereof is as follows.

Figure 3:
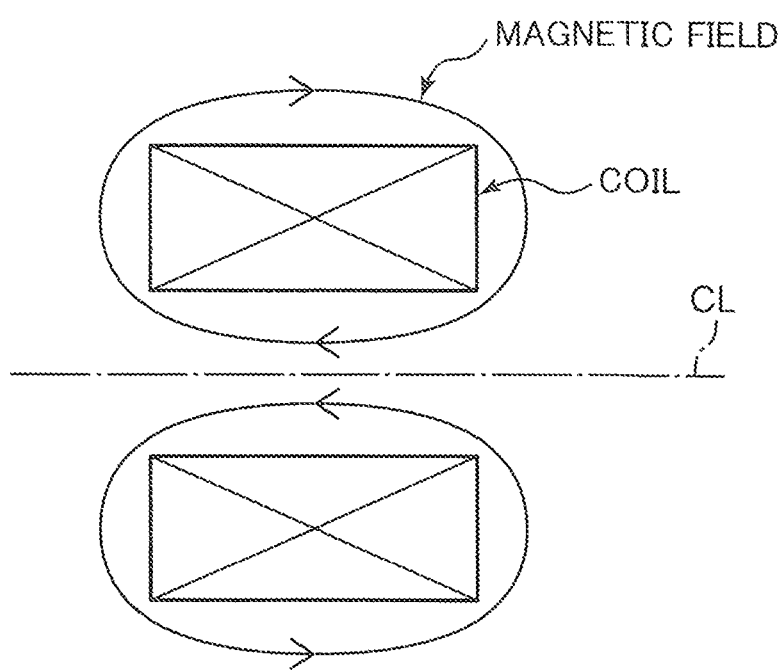
FIG. 3 is a schematic diagram illustrating a magnetic field generated by energization to the superconducting coils.

First, a magnetic field formed by the five superconducting coils 21 to 25 will be described with reference to FIG. 3. FIG. 3 is a schematic diagram illustrating a magnetic field formed by the five superconducting coils 21 to 25.

The magnetic field formed by the five superconducting coils 21 to 25 is inclined to the radial outside toward ends (left and right ends in FIG. 3) with respect to the center in the axial direction. Additionally, although not illustrated, an inclination of the magnetic field at the ends in the axial direction (inclination with respect to the center axis CL) increases toward the outside with respect to the center in the radial direction. The magnitude of the magnetic field formed by the five superconducting coils 21 to 25 decreases toward the outside with respect to the center in the radial direction.

Figure 4:
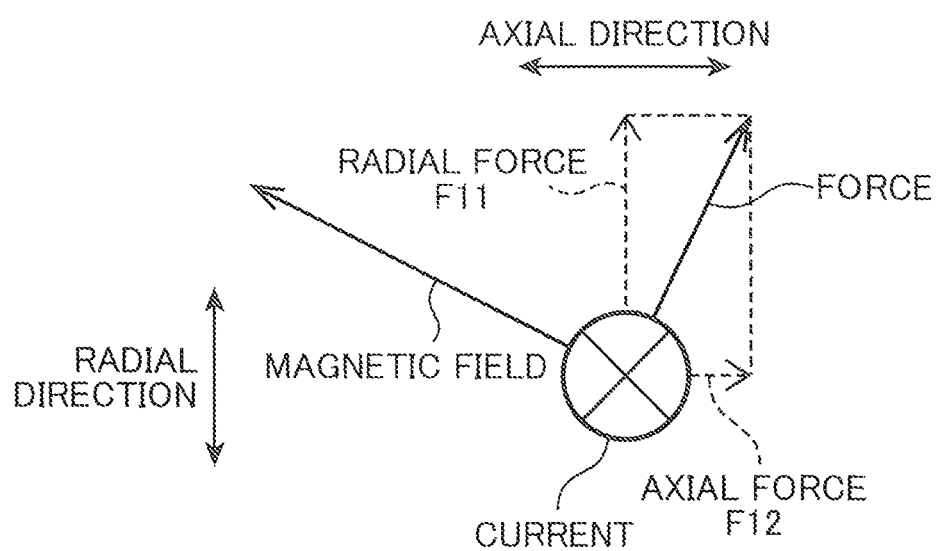
FIG. 4 is a schematic diagram illustrating force that acts on a tape wire when the magnetic fields are inclined to an axial direction of the superconducting coil.

Now, force that acts on the tape wire 20W when the magnetic field is inclined will be described with reference to FIG. 4. FIG. 4 is an explanatory diagram illustrating the force that acts on the tape wire 20W when the magnetic field is inclined.

In a case where the magnetic field is inclined to the center axis CL, force F1 acting on the tape wire 20W is decomposed into force F11 directed toward the radial outside, and force F12 directed toward the center in the radial direction.

Figure 5A:
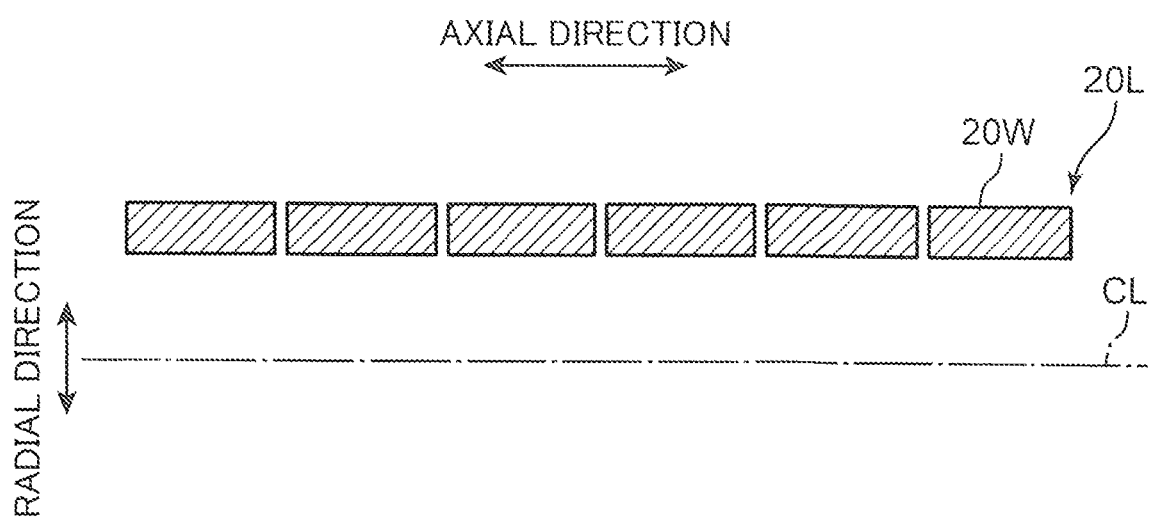
FIG. 5A is a schematic diagram illustrating a wire layer in a state where energization is not performed.
Figure 5B:
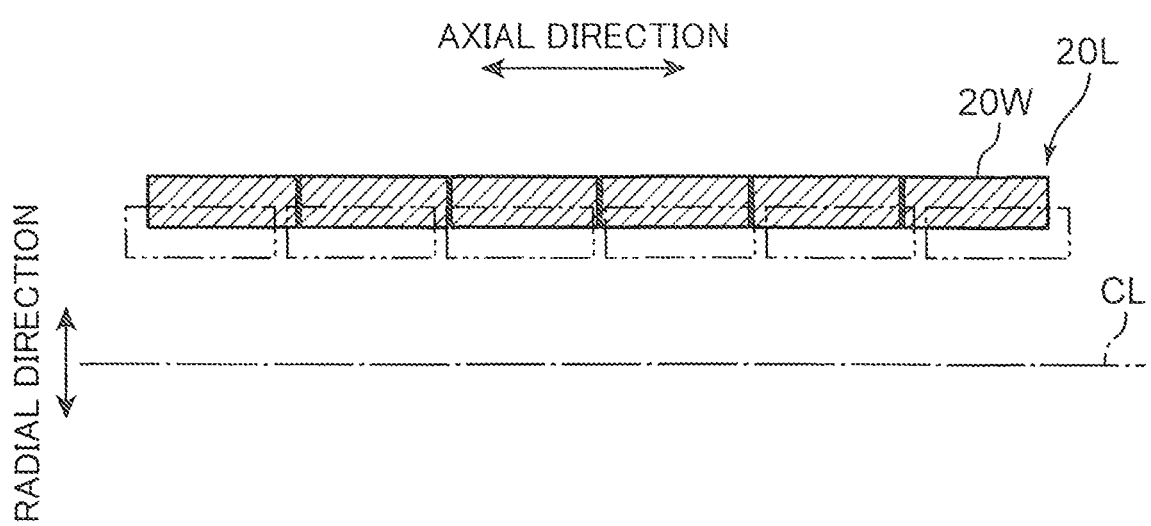
FIG. 5B is a schematic diagram of the wire layer when axial compressive force acts.
Figure 5C:
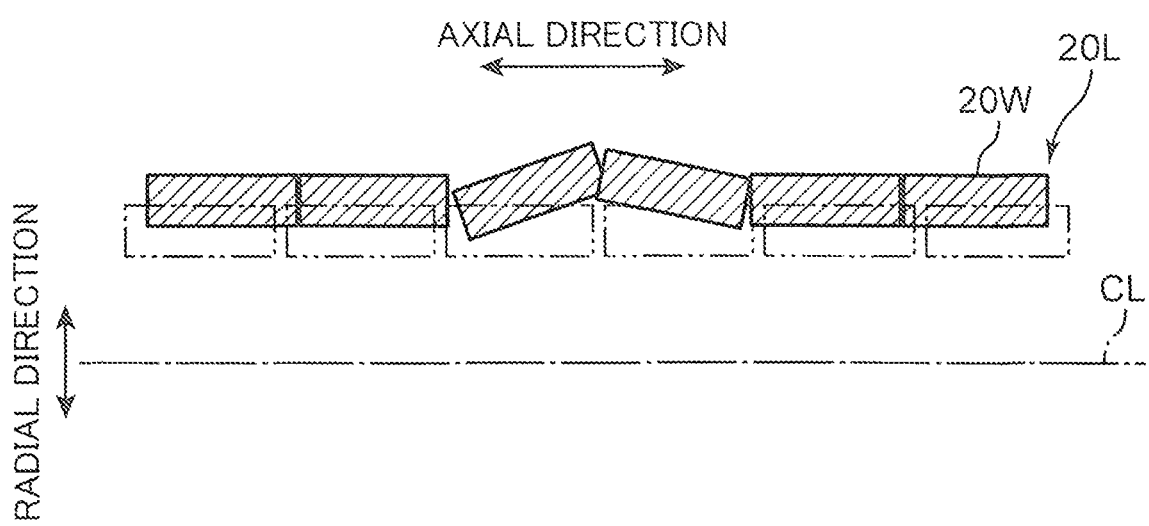
FIG. 5C is a schematic diagram illustrating a state where a part of the tape wire interferes with another part in the wire layer.

Now, a state of the wire layer 20L when the above force F1 acts on the tape wire 20W will be described with reference to FIG. 5A to FIG. 5C. FIG. 5A illustrates the wire layer 20L when energization to the tape wire 20W is not performed. FIG. 5B illustrates a state where the tape wire 20W are collected toward the center in the axial direction. FIG. 5C illustrates a state where a part of the tape wire 20W and another part interfere with each other in each wire layer 20L.

When the magnetic field is inclined to the center axis CL, the force F1 acting on the tape wire 20W can be decomposed into the force F11 directed toward the radial outside, and the force F12 directed toward the center in the radial direction. These forces F11, F12 act on the tape wire 20W composing the wire layer 20L, so that the state of the wire layers 20L is changed from the state illustrated in FIG. 5A to the state illustrated in FIG. 5B. That is, the tape wire 20W composing the wire layer 20L moves radially outward by the action of the force F11, and is collected toward the center in the axial direction by the action of the force F12.

With reference to FIG. 2, the internal radius of each of the five superconducting coils 21 to 25 is denoted by a1, the external radius of each of the five superconducting coils 21 to 25 is denoted by a2, and the coordinates of an arbitrary cross-section of the tape wire 20W composing each of the five superconducting coils 21 to 25 (cross-section located on i-th number of turns counted from the center in the axial direction of each of the five superconducting coils 21 to 25, and j-th wire layer 20L) are denoted by $(r_j, z_i)$. The force F12 acting on the tape wire 20W on the coordinates $(r_j, z_i)$ is expressed by the following Expression (1).

[Expression 1]

$$F12 = Br(r_j, z_i) \cdot I \cdot 2\pi r_j \qquad (1)$$

Axial compressive force acting on each of the five superconducting coils 21 to 25 is equivalent to force obtained by combining the force F12 expressed by Expression (1).

Where the number of turns per wire layer 20L is denoted by N, and the number of the wire layers 20L is denoted by L, pressure (surface pressure) Pz on the equator plane P1 of each of the five superconducting coils 21 to 25 is expressed by the following Expression (2).

[Expression 2]

$$P_z = \frac{1}{(\pi a_2^2 - \pi a_1^2)} \sum_{i=1}^{N/2} \sum_{j=1}^{L} Br(r_j, z_i) \cdot I \cdot 2\pi r_j \qquad (2)$$

The surface pressure Pz defined by Expression (2) is pressure obtained by dividing the axial compressive force acting on each of the five superconducting coils 21 to 25 by a cross-sectional area (cross-sectional area in the direction perpendicular to the center axis CL) of a superconducting coil on which the compressive force acts. That is, the surface pressure Pz has proportional relation to the axial compressive force acting on each of the five superconducting coils 21 to 25. Therefore, the magnitude of the axial compressive force acting on each of the five superconducting coils 21 to 25 can be grasped by the magnitude of the surface pressure Pz.

Herein, when the surface pressure Pz, that is, the axial compressive force acting on each of the five superconducting coils 21 to 25 becomes excessive, one part of the tape wire 20W interferes with another part in the wire layer 20L, as illustrated in FIG. 5C. In the example illustrated in FIG. 5C, the one part of the wire layers 20L deforms so as to project to the outside in the radial direction.

In order to suppress such interference of the tape wire 20W, in the superconducting magnet device 10, in a superconducting coil having excessive axial compressive force which acts when the respective numbers of turns of the respective tape wires 20W per wire layer 20L of the five superconducting coils 21 to 25 are the same, the number of turns of the tape wire 20W per wire layer 20L is decreased compared to a case where the excessive compressive force is generated. More specifically, the number of unit wire layer turns of each of the superconducting coils is expressed by a mean value of the respective numbers of turns of the tape wire 20W in the plurality of wire layers 20L, and the number of unit wire layer turns of each superconducting coil, that is, the number of turns of tape wire 20W per wire layer 20L of a superconducting coil among the five superconducting coils 21 to 25, the superconducting coil being disposed at a position, at which compressive force acting in the axial direction when the respective numbers of unit wire layer turns of the five superconducting coils 21 to 25 are the same is the largest, is smaller than a mean value of the respective numbers of unit wire layer turns of the five superconducting coils 21 to 25. The reason thereof is as follows.

The axial compressive force acting on each of the five superconducting coils 21 to 25 is force obtained by combining the axial force F12 acting on the tape wire 20W, as described above. Therefore, when the number of the cross-sections of the tape wire 20W included in the single wire layer 20L (the number of the cross-sections of the tape wire 20W arranged in the axial direction) in an arbitrary cross-section (cross-section including the center axis CL, and cut by a plane expanding in the axial direction and the radial direction), that is, the number of turns of the tape wire 20W is decreased, the axial compressive force generated due to energization can be reduced.

When the type of each tape wire 20W is not changed, the axial length of each wire layer 20L can be shortened by decreasing the number of turns of the tape wire 20W. That is, it is possible to avoid the increase of the axial size of each of the five superconducting coils 21 to 25.

In order to increase the magnetic field formed by the five superconducting coils 21 to 25, the total number of turns of the tape wires 20W only needs to be ensured. In order to perform the above, the number of the wire layers 20L only needs to be increased.

The superconducting magnet device 10 includes the three outer superconducting coils 31 to 33, and the three outer superconducting coils 41 to 43, in addition to the five superconducting coils 21 to 25. Therefore, the superconducting magnet device 10 can form a larger magnetic field.

The axial size of each of the five superconducting coils 21 to 25 is not limited to the axial size illustrated in FIG. 1. For example, the axial size is suitably changed in accordance with the width (length in which the center axis CL extends) of the tape wire 20W used in each of the five superconducting coils 21 to 25, or the like. At least one of the five superconducting coils 21 to 25 may be formed by the tape wire 20W having a different width from the tape wire 20W of another superconducting coil. The total number of turns of the tape wires 20W of at least one of the five superconducting coils 21 to 25 may be larger than that of other superconducting coils.

In the superconducting magnet device 10, the number of unit wire layer turns of each of the superconducting coils is expressed by a mean value of the respective number of turns of the tape wires 20W of the plurality of wire layers 20L of at least the radially adjacent two superconducting coils 21 to 25 in the five superconducting coils 21 to 25, and the number of turns unit wire layer of the superconducting coil disposed at a position, at which compressive force acting in the axial direction when the respective numbers of unit wire layer turns of at least these two superconducting coils are the same is the largest, is smaller than a mean value of the respective numbers of unit wire layer turns of at least these two superconducting coils.

Second Embodiment

A superconducting magnet device 11 according to a second embodiment of the present invention will be described with reference to FIG. 6. The superconducting magnet device 11 is different from the superconducting magnet device 10 in that the superconducting magnet device 11 includes only five superconducting coils 21 to 25.

Similarly to the superconducting magnet device 10, in the superconducting magnet device 11, the number of cross-sections of a tape wire 20W included in a single wire layer 20L (the number of the cross-sections of the tape wire 20W arranged in the axial direction), that is, the number of turns of the tape wire 20W is decreased, so that axial compressive force generated due to energization can be reduced.

The axial size of each of the five superconducting coils 21 to 25 is not limited to the axial size illustrated in FIG. 6. For example, the axial size is suitably changed in accordance with the width (length in which a center axis CL extends) of the tape wire 20W used in each of the five superconducting coils 21 to 25, or the like. At least one of the five superconducting coils 21 to 25 may be formed by the tape wire 20W having a different width from the tape wire 20W of another superconducting coil. The total number of turns of the tape wires 20W of at least one of the five superconducting coils 21 to 25 may be larger than that of other superconducting coils.

In the superconducting magnet device 11, the number of unit wire layer turns of each of the superconducting coils is expressed by a mean value of the respective number of turns of the tape wires 20W of the plurality of wire layers 20L of at least the radially adjacent two superconducting coils 21 to 25 in the five superconducting coils 21 to 25, and the number of turns unit wire layer of the superconducting coil disposed at a position, at which compressive force acting in the axial direction when the respective numbers of unit wire layer turns of at least these two superconducting coils are the same is the largest, is smaller than a mean value of the respective numbers of unit wire layer turns of at least these two superconducting coils.

EXAMPLE

Example 1

The superconducting magnet device according to the first embodiment of the present invention will be described with reference to Table 1 and Table 2.

TABLE 1

|  | 2a1 (mm) | 2a2 (mm) | b2-b1 (mm) | Z0 (mm) | Turns | Layer | Turns/layer | Pz |
|---|---|---|---|---|---|---|---|---|
| COIL21 | 79.0 | 148.2 | 960.0 | 0.0 | 24072 | 102 | 236 | 49.81 |
| COIL22 | 158.2 | 240.6 | 924.0 | 0.0 | 21412 | 106 | 202 | 49.95 |
| COIL23 | 250.6 | 332.9 | 888.0 | 0.0 | 20564 | 106 | 194 | 50.40 |
| COIL24 | 342.9 | 425.2 | 892.0 | 0.0 | 20670 | 106 | 195 | 50.25 |
| COIL25 | 435.2 | 487.3 | 933.0 | 0.0 | 13058 | 64 | 204 | 49.72 |
| COIL31 | 501.3 | 532.2 | 1150.0 | 0.0 | 4820 | 10 | 482 | |
| COIL32 | 532.2 | 568.2 | 1150.0 | 0.0 | 5952 | 12 | 496 | |
| COIL33 | 568.2 | 608.8 | 1150.0 | 0.0 | 7196 | 14 | 514 | |
| COIL41 | 622.8 | 662.0 | 1150.0 | 0.0 | 7826 | 14 | 559 | |
| COIL42 | 662.3 | 699.1 | 1150.0 | 0.0 | 6414 | 14 | 601 | |
| COIL43 | 699.4 | 723.4 | 1150.0 | 0.0 | 6630 | 10 | 663 | |
| COIL51 | 737.4 | 815.9 | 376.0 | 387.0 | 7684 | 34 | 226 | |
| COIL52 | 737.4 | 815.9 | 376.0 | −387.0 | 7684 | 34 | 226 | |
| COIL55 | 860.8 | 932.7 | 100.0 | 0.0 | 1710 | 30 | 57 | |
| COIL53 | 816.3 | 932.7 | 376.0 | 387.0 | 7000 | 40 | 175 | |
| COIL54 | 816.3 | 932.7 | 376.0 | −387.0 | 7000 | 40 | 175 | |
| COIL61 | 1175.1 | 1303.7 | 440.0 | 355.0 | 8148 | 42 | 194 | |
| COIL62 | 1175.1 | 1303.7 | 440.0 | −355.0 | 8148 | 42 | 194 | |

Table 1 shows the detail of the various coils (the five superconducting coils 21 to 25, the three first outer superconducting coils 31 to 33, the three second outer superconducting coils 41 to 43, the five correction coils 51 to 55, and the two shield coils 61, 62) provided in the superconducting magnet device 10 (Example 1). In Table 1, a1 denotes the inner diameter of each coil, a2 denotes the outer diameter of each coil, b2−b1 denotes the axial length of each coil, Z0 denotes the position of the center in the axial direction of each coil (position in the direction in which the center axis CL extends), Turns denotes the total number of turns of a wire in each coil, Layer denotes the total number of the wire layers 20L in each coil, and Turns/Layer denotes the number of turns of a wire per wire layer 20L. Additionally, Table 1 also shows surface pressure Pz (unit: MPa) on the equator plane P1 of each of the five superconducting coils 21 to 25. The surface pressure Pz is calculated based on the above Expression (2).

TABLE 2

|  | 2a1 (mm) | 2a2 (mm) | b2-b1 (mm) | Z0 (mm) | Turns | Layer | Turns/layer | Pz |
|---|---|---|---|---|---|---|---|---|
| COIL210 | 79.0 | 148.2 | 916.0 | 0.0 | 22950 | 102 | 225 | 42.23 |
| COIL220 | 158.2 | 229.0 | 915.0 | 0.0 | 18000 | 90 | 200 | 46.18 |
| COIL230 | 239.0 | 309.8 | 915.0 | 0.0 | 18000 | 90 | 200 | 54.20 |
| COIL240 | 319.8 | 392.1 | 915.0 | 0.0 | 18400 | 92 | 200 | 55.90 |
| COIL250 | 402.1 | 487.3 | 915.0 | 0.0 | 22000 | 110 | 200 | 50.08 |
| COIL31 | 501.3 | 532.2 | 1150.0 | 0.0 | 4820 | 10 | 482 | |
| COIL32 | 532.2 | 568.2 | 1150.0 | 0.0 | 5952 | 12 | 496 | |
| COIL33 | 568.2 | 608.8 | 1150.0 | 0.0 | 7196 | 14 | 514 | |
| COIL41 | 622.8 | 662.0 | 1150.0 | 0.0 | 7826 | 14 | 559 | |
| COIL42 | 662.3 | 699.1 | 1150.0 | 0.0 | 8414 | 14 | 601 | |
| COIL43 | 699.4 | 723.4 | 1150.0 | 0.0 | 6630 | 10 | 663 | |
| COIL51 | 737.4 | 815.9 | 376.0 | 387.0 | 7684 | 34 | 226 | |
| COIL52 | 737.4 | 815.9 | 376.0 | −387.0 | 7684 | 34 | 226 | |
| COIL55 | 860.8 | 932.7 | 93.0 | 0.0 | 1590 | 30 | 53 | |
| COIL53 | 816.3 | 932.7 | 376.0 | 387.0 | 7000 | 40 | 175 | |
| COIL54 | 816.3 | 932.7 | 376.0 | −387.0 | 7000 | 40 | 175 | |
| COIL61 | 1175.1 | 1303.7 | 442.0 | 354.0 | 8190 | 42 | 195 | |
| COIL62 | 1175.1 | 1303.7 | 442.0 | −354.0 | 8190 | 42 | 195 | |

Table 2 shows the detail of various coils provided in a superconducting magnet device 100 (Comparative Example 1) illustrated in FIG. 7. Herein, the superconducting magnet device according to Comparative Example 1 is different from the superconducting magnet device according to Example 1 in that the superconducting magnet device includes five superconducting coils 210 to 250 in place of the five superconducting coils 21 to 25. The axial lengths of the five superconducting coils 210 to 250 are substantially the same. Additionally, Table 2 also shows surface pressure Pz (unit: MPa) on an equator plane P1 of each of the five superconducting coils 210 to 250. The surface pressure Pz is calculated based on the above Expression (2), similarly to the five superconducting coils 21 to 25 in Table 1.

With reference to Table 2, in the superconducting magnet device according to Comparative Example 1, axial compressive force (surface pressure Pz) that acts on the superconducting coil 230, and axial compressive force (surface pressure Pz) that acts on the superconducting coil 240 are each larger than axial compressive force that acts on each of other three superconducting coils 210, 220, 250. In the superconducting magnet device according to Comparative Example 1, a mean value of surface pressures that are proportional to the respective axial compressive forces acting on the five superconducting coils 210 to 250 is 49.72 (MPa), and a mean value of surface pressures that are proportional to the respective axial compressive forces acting on the four superconducting coils 220 to 250 is 51.59 (MPa).

On the other hand, in the superconducting magnet device according to Example 1, as shown in Table 1, the axial compressive force (surface pressure Pz) acting on the superconducting coil 23 is smaller than the axial compressive force (surface pressure Pz) acting on the superconducting coil 230. Similarly, the axial compressive force (surface pressure Pz) acting on the superconducting coil 24 is smaller than the axial compressive force (surface pressure Pz) acting on the superconducting coil 240.

The reason why the axial compressive force (surface pressure Pz) acting on the superconducting coil 23 is smaller than the axial compressive force (surface pressure Pz) acting on the superconducting coil 230 is that the axial length of the superconducting coil 23 is shorter than the axial length of the superconducting coil 230. Similarly, the reason why the axial compressive force (surface pressure Pz) acting on the superconducting coil 24 is smaller than the axial compressive force (surface pressure Pz) acting on the superconducting coil 240 is that the axial length of the superconducting coil 24 is shorter than the axial length of the superconducting coil 240.

Herein, in the superconducting magnet device according to Comparative Example 1, the employed wires of the various coils are the same as those in the superconducting magnet device according to Example 1. That is, the tape wire 20W used in the superconducting coil 23 is the same as the tape wire used in the superconducting coil 230. Similarly, the tape wire 20W used in the superconducting coil 24 is the same as the tape wire used in the superconducting coil 240.

As described above, the fact that the axial length of the superconducting coil 23 is shorter than the axial length of the superconducting coil 230 means that the number of turns of the tape wire 20W per wire layer 20L in the superconducting coil 23 is smaller than the number of turns of the tape wire per wire layer in the superconducting coil 230. Similarly, the fact that the axial length of the superconducting coil 24 is shorter than the axial length of the superconducting coil 240 means that the number of turns of the tape wire 20W per wire layer 20L in the superconducting coil 24 is smaller than the number of turns of the tape wire per wire layer in the superconducting coil 240.

That is, in the superconducting magnet device according to Example 1, the number of turns of the tape wire 20W per wire layer 20L in each of the superconducting coil 23 and the superconducting coil 24 is decreased, compared to the superconducting magnet device according to Comparative Example 1. In the superconducting magnet device according to Example 1, the number of turns of the tape wire 20W per wire layer 20L in each of the superconducting coil 23 and the superconducting coil 24 is smaller than the mean value (198.75) of the respective numbers of turns of the tape wires 20W per wire layer 20L in the four coils 22 to 25, or the mean value (206.2) of the respective numbers of turns of the tape wires 20W per wire layer 20L in the five coils 21 to 25. In the superconducting magnet device according to Example 1, the axial compressive force (axial compressive force generated due to energization) acting on each of the superconducting coil 23 and the superconducting coil 24 can be reduced.

The reason why the axial compressive force acting on the superconducting coil 250 is smaller than the axial compressive force acting on the superconducting coil 230 or the superconducting coil 240 is that inclination to the center axis CL of the magnetic field acting on the superconducting coil 250 is decreased by arrangement of the first outer superconducting coils 31 to 33 and the second outer superconducting coils 41 to 43 outside the superconducting coil 250.

Example 2

Now, the superconducting magnet device according to the second embodiment of the present invention will be described with reference to Table 3 and Table 4.

TABLE 3

|  | 2a1 (mm) | 2a2 (mm) | b2-b1 (mm) | Z0 (mm) | Turns | Layer | Turns/layer | Pz |
|---|---|---|---|---|---|---|---|---|
| COIL21 | 79.0 | 114.5 | 545.0 | 0.0 | 6650 | 50 | 133 | 48.26 |
| COIL22 | 124.5 | 163.6 | 510.0 | 0.0 | 6200 | 50 | 124 | 48.62 |
| COIL23 | 173.6 | 212.7 | 485.0 | 0.0 | 5900 | 50 | 118 | 48.37 |
| COIL24 | 222.7 | 261.8 | 480.0 | 0.0 | 5850 | 50 | 117 | 48.07 |
| COIL25 | 271.8 | 310.9 | 495.0 | 0.0 | 6050 | 50 | 121 | 48.22 |

Table 3 shows the detail of the five superconducting coils 21 to 25 provided in the superconducting magnet device 11 (Example 2).

TABLE 4

|  | 2a1 (mm) | 2a2 (mm) | b2-b1 (mm) | Z0 (mm) | Turns | Layer | Turns/layer | Pz |
|---|---|---|---|---|---|---|---|---|
| COIL210 | 79.0 | 114.5 | 500.0 | 0.0 | 6100 | 50 | 122 | 38.66 |
| COIL220 | 124.5 | 163.6 | 500.0 | 0.0 | 6100 | 50 | 122 | 45.83 |
| COIL230 | 173.6 | 212.7 | 500.0 | 0.0 | 6100 | 50 | 122 | 51.54 |
| COIL240 | 222.7 | 261.8 | 500.0 | 0.0 | 6100 | 50 | 122 | 51.97 |
| COIL250 | 271.8 | 310.9 | 500.0 | 0.0 | 6100 | 50 | 122 | 47.19 |

Figure 8:
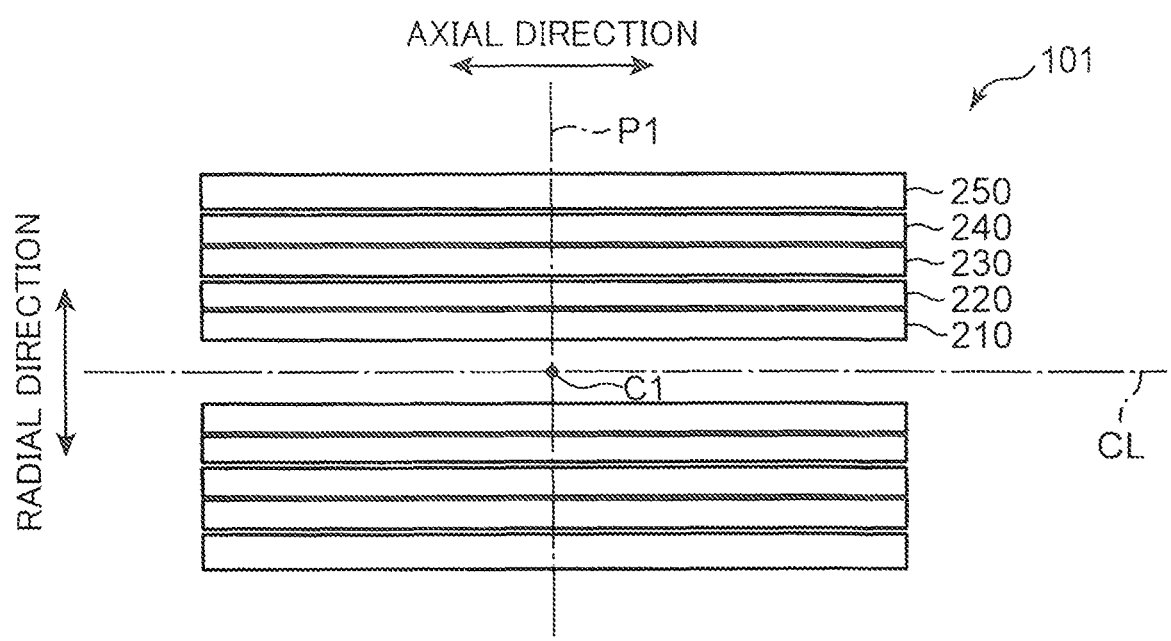
FIG. 8 is a schematic diagram illustrating a schematic configuration of a superconducting magnet device according to Comparative Example 2.

Table 4 shows the detail of various coils provided in a superconducting magnet device 101 (Comparative Example 2) illustrated in FIG. 8. Herein, the superconducting magnet device according to Comparative Example 2 is different from the superconducting magnet device according to Comparative Example 1 in that the superconducting magnet device includes only five superconducting coils 210 to 250. In the superconducting magnet device according to Comparative Example 2, a mean value of surface pressures that are proportional to the respective axial compressive forces of the five superconducting coils 210 to 250 is 47.04 (MPa).

As apparent from Table 3 and Table 4, in the superconducting magnet device according to Example 2, the number of turns of the tape wire 20W per wire layer 20L in each of the superconducting coil 23 and the superconducting coil 24 is decreased, compared to the superconducting magnet device according to Comparative Example 2. In the superconducting magnet device according to Example 2, the number of turns of the tape wire 20W per wire layer 20L in each of the superconducting coil 23 and the superconducting coil 24 is smaller than the mean value (122.6) of the respective numbers of turns of the tape wires 20W per wire layer 20L in the five coils 21 to 25. In the superconducting magnet device according to Example 2, the axial compressive force (axial compressive force generated due to energization) acting on each of the superconducting coil 23 and the superconducting coil 24 can be reduced.

Example 3

Now, an application of the superconducting magnet device according to the second embodiment of the present invention will be described with reference to Table 5 and Table 6.

TABLE 5

|  | 2a1 (mm) | 2a2 (mm) | b2-b1 (mm) | Z0 (mm) | Turns | Layer | Turns/layer | Pz |
|---|---|---|---|---|---|---|---|---|
| COIL21 | 79.0 | 114.5 | 542.0 | 0.0 | 6600 | 50 | 132 | 49.68 |
| COIL22 | 124.5 | 163.6 | 515.0 | 0.0 | 6300 | 50 | 126 | 49.85 |
| COIL23 | 173.8 | 212.7 | 515.0 | 0.0 | 5600 | 50 | 112 | 49.70 |
| COIL24 | 222.7 | 261.8 | 515.0 | 0.0 | 5800 | 50 | 112 | 49.43 |
| COIL25 | 271.8 | 310.9 | 535.0 | 0.0 | 5800 | 50 | 116 | 49.83 |

Table 5 shows the detail of five superconducting coils 21 to 25 provided in a superconducting magnet device (Example 3) according to the application of the second embodiment. In Example 3, the total number of turns of the tape wire 20W in each of the two superconducting coils 21 to 22 is larger than the total number of turns of the tape wire 20W in each of the three superconducting coils 23 to 25.

TABLE 6

|  | 2a1 (mm) | 2a2 (mm) | b2-b1 (mm) | Z0 (mm) | Turns | Layer | Turns/layer | Pz |
|---|---|---|---|---|---|---|---|---|
| COIL210 | 79.0 | 114.5 | 520.0 | 0.0 | 6350 | 50 | 127 | 44.44 |
| COIL220 | 124.5 | 163.6 | 520.0 | 0.0 | 6350 | 50 | 127 | 52.21 |
| COIL230 | 173.6 | 212.7 | 520.0 | 0.0 | 5650 | 50 | 113 | 51.60 |
| COIL240 | 222.7 | 261.8 | 520.0 | 0.0 | 5650 | 50 | 113 | 51.74 |
| COIL250 | 271.8 | 310.9 | 520.0 | 0.0 | 5650 | 50 | 113 | 46.96 |

Table 6 shows the detail of various coils provided in a superconducting magnet device according to Comparative Example 3. Herein, the superconducting magnet device according to Comparative Example 3 only includes five superconducting coils 210 to 250 like the superconducting magnet device according to Comparative Example 2. However, in Comparative Example 3, the number of turns of the tape wire 20W per wire layer 20L in each of the two superconducting coils 210 and 220 is larger than the number of turns of the tape wire 20W per wire layer 20L in each of the three superconducting coils 230 to 250. In the superconducting magnet device according to Comparative Example 3, a mean value of surface pressures that are proportional to the respective axial compressive forces of the two superconducting coils 210 and 220 is 48.33 (MPa), and a mean value of surface pressures that are proportional to the respective axial compressive forces of the three superconducting coils 230 to 250 is 50.1 (MPa).

As apparent from Table 5 and Table 6, in the superconducting magnet device according to Example 3, the number of turns of the tape wire 20W per wire layer 20L in each of the superconducting coil 22, the superconducting coil 23, and the superconducting coil 24 is decreased, compared to the superconducting magnet device according to Comparative Example 3. In the superconducting magnet device according to Example 3, the number of turns of the tape wire 20W per wire layer 20L in the superconducting coil 22 is smaller than the mean value (129) of the respective numbers of turns of the tape wires 20W per wire layer 20L in the two coils 21 and 22, and the number of turns of the tape wire 20W per wire layer 20L in the superconducting coil 23 or the superconducting coil 24 is smaller than the mean value (113.33) of the respective numbers of turns of the tape wires 20W per wire layer 20L in the three coils 23 to 25. In the superconducting magnet device according to Example 3, the axial compressive force (axial compressive force generated due to energization) acting on each of the superconducting coil 22, the superconducting coil 23, and the superconducting coil 24 can be reduced.

Although, the embodiments of the present invention are thus described in detail, these are merely illustrative, and the above embodiments can be implemented by appropriately changing without departing from the spirit of the present invention.

In the above embodiments, the main magnetic field generating coil group may be configured by only the five superconducting coils 21 to 25, or may be configured by the five superconducting coils 21 to 25, and the three superconducting coils 31 to 33, or may be configured by the five superconducting coils 21 to 25 and the three superconducting coils 41 to 43.

In the above embodiments, the number of the superconducting coils is five. However, as long as the number of the superconducting coils is two or more, the number of the superconducting coils is not limited.

The embodiments of the present invention, and the applications thereof are thus described in detail, but are merely illustrative, and the present invention is not limited to the above embodiment, the application, and the like.

In the present invention, a position at which compressive force generated due to energization to each of the plurality of superconducting coils (compressive force acting on the plurality of superconducting coils in the direction in which the common center axis extends) is not limited to the center in the axial direction of each of the superconducting coils.

The above specific embodiments mainly include the invention having the following structure.

A superconducting magnet device according to the present invention is a superconducting magnet device including a plurality of superconducting coils arranged concentrically with each other. The plurality of superconducting coils include a plurality of first superconducting coils each formed by a tape wire, each of the plurality of first superconducting coils has a plurality of wire layers layered in a direction perpendicular to a center axis shared by the plurality of first superconducting coils, each of the plurality of wire layers is formed of the tape wire spirally winding around the center axis a plurality of times, the number of unit wire layer turns of a specific first superconducting coil among the plurality of first superconducting coils is smaller than a mean value of the respective numbers of unit wire layer turns of the plurality of first superconducting coils, the number of unit wire layer turns of each of the first superconducting coils being expressed by a mean value of the respective numbers of turns of the tape wire in the plurality of wire layers, the specific first superconducting coil being disposed at such a position that compressive force acting on the specific first superconducting coil in a direction in which the center axis extends is the largest on the assumption that the respective numbers of unit wire layer turns of the plurality of first superconducting coils were the same.

In the above superconducting magnet device, in the first superconducting coil that is disposed at the position, at which the compressive force acting in the (axial) direction in which the center axis extends when the numbers of unit wire layer turns are the same is the largest, among the plurality of first superconducting coils, it is possible to reduce compressive force that acts in the axial direction. As a result, it is possible to suppress interference of a part of the tape wire with another part.

In the above superconducting magnet device, the number of unit wire layer turns of the specific first superconducting coil is preferably smaller than the number of unit wire layer turns of another first superconducting coil.

In such an aspect, in the first superconducting coil disposed at the position, at which the compressive force acting in the (axial) direction in which the center axis extends is the largest, it is possible to reduce the compressive force that acts in the axial direction. As a result, it is possible to suppress interference of a part of the tape wire with another part.

In the above superconducting magnet device, the number of unit wire layer turns of a first superconducting coil among the plurality of first superconducting coils is smaller than a mean value of the respective numbers of unit wire layer turns of the plurality of first superconducting coils, the first superconducting coil being disposed at such a position that compressive force acting on the first superconducting coil is larger than a mean value of the compressive forces on the assumption that the respective numbers of unit wire layer turns of the plurality of first superconducting coils were the same.

In such an aspect, in the first superconducting coil that is disposed at the position, at which compressive force larger than a mean value of the compressive forces when the numbers of unit wire layer turns are the same acts, among the plurality of first superconducting coils, it is possible to reduce the compressive force. As a result, it is possible to suppress interference of a part of the tape wire with another part.

The above superconducting magnet device preferably further includes a plurality of second superconducting coils each formed of wound wire having a circular cross-section or a rectangular cross-section, the plurality of second superconducting coils surrounding the plurality of first superconducting coils and disposed concentrically with the plurality of first superconducting coils. Each of the plurality of second superconducting coils has a greater length, in the direction in which the center axis extends, than a length of each of the plurality of first superconducting coils.

In such an aspect, the plurality of second superconducting coils are provided in addition to the plurality of first superconducting coils, and therefore it is possible to make a magnetic field generated by the superconducting magnet device larger.

This application is based on Japanese Patent application No. 2017-088103 filed in Japan Patent Office on Apr. 27, 2017, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. A superconducting magnet device comprising a plurality of superconducting coils arranged concentrically with each other, wherein
the plurality of superconducting coils include a plurality of first superconducting coils each formed by a tape wire and extending in an axial direction of the superconducting magnet device that is a center axis shared by the plurality of the first superconducting coils,
each of the plurality of first superconducting coils has a plurality of wire layers layered in a layering direction that is perpendicular to the axial direction, each wire layer being formed by the tape wire being spirally wound around the center axis in the axial direction a respective number of unit wire layer turns,
the plurality of first superconducting coils includes
one or more specific first superconducting coils, the one or more specific first superconducting coils being disposed at a center of the plurality of first superconducting coils in the layering direction; and
at least two other first superconducting coils except for the specific first superconducting coils, the at least two other first superconducting coils being disposed at opposite ends of the plurality of first superconducting coils in the layering direction,
and
the respective number of unit wire layer turns in each wire layer of each specific first superconducting coil is smaller than the respective numbers of unit wire layer turns in each wire layer of the other first superconducting coils, and a number of wire layers of each specific first superconducting coil is larger than a number of wire layers in each other first superconducting coils.

2. The superconducting magnet device according to claim 1, further comprising
a plurality of second superconducting coils each formed of wound wire having a circular cross-section or a rectangular cross-section, the plurality of second superconducting coils surrounding the plurality of first superconducting coils and disposed concentrically with the plurality of first superconducting coils, wherein
each of the plurality of second superconducting coils has a greater length, in the direction in which the center axis extends, than a length of each of the plurality of first superconducting coils.

3. The superconducting magnet device according to claim 1, wherein
the plurality of first superconducting coils includes an innermost first superconducting coil, an outermost superconducting coil, and middle superconducting coils that are sandwiched between the innermost first superconducting coil and the outermost superconducting coil, and the innermost first superconducting coil and the outermost superconducting coil are included in the other first superconducting coils and the middle superconducting coils are included in the specific first superconducting coils.

4. The superconducting magnet device according to claim 1, wherein the plurality of first superconducting coils includes an innermost first superconducting coil and a second innermost first superconducting coil that is disposed next to the innermost first superconducting coil, and a length of the innermost first superconducting coil in the axial direction is larger than a length of the second innermost first superconducting coil in the axial direction.

* * * * *